United States Patent [19]
Martiska et al.

[11] Patent Number: 5,667,922
[45] Date of Patent: Sep. 16, 1997

[54] METHOD OF SEMICONDUCTOR FABRICATION UTILIZING RINSE OF POLYIMIDE FILM

[75] Inventors: Thomas J. Martiska, Boylston; Stephen Darling, Worcester, both of Mass.

[73] Assignee: Allegro Microsystems, Inc., Worcester, Mass.

[21] Appl. No.: 639,340

[22] Filed: Apr. 26, 1996

[51] Int. Cl.$^6$ .................................................. G03F 7/00
[52] U.S. Cl. ........................... 430/9; 430/313; 430/317; 430/327; 430/330
[58] Field of Search ........................... 430/311, 313, 430/317, 323, 327, 330, 9

[56] References Cited

U.S. PATENT DOCUMENTS

| | | | |
|---|---|---|---|
| 3,937,857 | 2/1976 | Brummett et al. | 427/98 |
| 4,832,808 | 5/1989 | Buchwalter | 204/181.7 |
| 5,168,542 | 12/1992 | Chakravorty | 385/132 |
| 5,342,734 | 8/1994 | Lazarus et al. | 430/270 |
| 5,399,239 | 3/1995 | Pai et al. | 156/656 |
| 5,409,568 | 4/1995 | Vasche | 156/657 |
| 5,468,597 | 11/1995 | Calabrese et al. | 430/315 |
| 5,470,693 | 11/1995 | Sachdev et al. | 430/315 |
| 5,472,370 | 12/1995 | Malshe et al. | 451/41 |

OTHER PUBLICATIONS

Scientific American, Sep., 1977, vol. 237, No. 3, pp. 110–128 "The Fabrication of Microelectronic Circuits" by William G. Oldham (377 Scientific American Offprints).

Microelectrnic Manufacturing and Testing, Oct., 1985, pp. 16–18, "Integrated Circuit Fabrication" by Peter VanZant.
Microelectronic Manufacturing and Testing, Nov., 1985, pp. 22–24 "Solid State Device Technologies" by Peter VanZant.
Microelectronic Manufacturing and Testing, "Semiconductor Devices and Circuits" by Peter VanZant.

*Primary Examiner*—Kathleen Duda
*Attorney, Agent, or Firm*—Samuels, Gauthier, Stevens & Reppert

[57] ABSTRACT

A method of fabricating a patterned polyimide film on a semiconductor wafer including spin coating the wafer with a polyimide precursor solution, baking the polyimide precursor solution in order to remove solvents from and to slightly cure the solution to form a polyimide film, and rinsing the polyimide film with deionized water immediately following the baking step prior to further processing. The rinsing in part serves to further remove solvents associated with the polyimide film. The process continues with photolithography techniques in which the wafer spin coated with a selected photoresist to form a photoresist film immediately following the rinsing step, and a baking of the photoresist film. Thereafter, the photoresist film is exposed to radiation through a photomask, and developed with a solution to form a pattern. The pattern is then etched into the polyimide film with the solution. The remaining portions of the photoresist are removed with a chemical stripper. The wafer is then baked to fully cure the pattern formed in the polyimide film. The present invention provides an improved semiconductor fabrication process which yields better defined patterns and greatly enhances the uniformity and repeatability of the photolithographic process.

12 Claims, 14 Drawing Sheets

| AFTER COAT PROCESS | WAFER NUMBER | BARE WAFER THICKNESS | AFTER PI COAT | PI WEIGHT | AFTER FULL CURE WEIGHT | INITIAL WAFER DELTA | COAT/CURE DELTA | COAT/CURE % LOSS |
|---|---|---|---|---|---|---|---|---|
| SEMI RINSE | 1 | 8.6646 | 8.6911 | 0.0265 | 8.6852 | 0.0206 | -0.0059 | -22.3 |
| SEMI RINSE | 2 | 9.5467 | 9.5731 | 0.0264 | 9.5673 | 0.0206 | -0.0058 | -22.0 |
| STRIPPED | 3 | 8.538 | 8.5623 | 0.0243 | 8.584 | 0.046 | 0.0217 | 89.3 |
| STRIPPED | 4 | 8.6225 | 8.6469 | 0.0244 | 8.6429 | 0.0204 | -0.004 | -16.4 |
| NONE | 5 | 9.4951 | 9.5218 | 0.0267 | 9.5152 | 0.0201 | -0.0066 | -24.7 |
| NONE | 6 | 8.6135 | 8.6407 | 0.0272 | 8.6342 | 0.0207 | -0.0065 | -23.9 |

| AFTER COAT PROCESS | WAFER NUMBER | PI COAT THICKNESS | AFTER "WET" PROCESS | DELTA | AFTER CURE THICKNESS | DELTA FROM INITIAL | % CURE LOSS |
|---|---|---|---|---|---|---|---|
| SEMI RINSE | 1 | 24560 | 24030 | -530 | 18820 | -5740 | -23.4 |
| SEMI RINSE | 2 | 24510 | 23810 | -700 | 18760 | -5750 | -23.5 |
| STRIPPED | 3 | 24460 | 21950 | -2510 | 18750 | -5710 | -23.3 |
| STRIPPED | 4 | 24460 | 22030 | -2530 | 18730 | -5830 | -23.7 |
| NONE | 5 | 24560 | 24620 | 60 | 18810 | -5750 | -23.4 |
| NONE | 6 | 24710 | 24740 | 30 | 18910 | -5800 | -23.5 |

FIG. 6

| WAFER # | POLYIMIDE WEIGHT | WEIGHT DELTA FROM RINSE | % WEIGHT LOSS |
|---|---|---|---|
| 720 | 0.0286 | -0.0006 | -2.10 |
| 183 | 0.0286 | -0.0006 | -2.10 |
| 715 | 0.0289 | -0.0008 | -2.77 |
| 452 | 0.029 | -0.0008 | -2.76 |
| 717 | 0.029 | -0.0008 | -2.76 |
| 752 | 0.029 | -0.0006 | -2.07 |
| 751 | 0.029 | -0.0007 | -2.41 |
| 724 | 0.0284 | -0.0007 | -2.46 |
| 753 | 0.0287 | -0.0007 | -2.44 |
| 1723 | 0.0255 | -0.0006 | -2.35 |
| 937 | 0.0289 | -0.0006 | -2.08 |
| 1271 | 0.0287 | -0.0008 | -2.79 |
| 1272 | 0.0287 | -0.0006 | -2.09 |
| 951 | 0.0286 | -0.0006 | -2.10 |
| 758 | 0.0286 | -0.0006 | -2.10 |
| 760 | 0.0287 | -0.0008 | -2.79 |
| 759 | 0.0296 | -0.0008 | -2.70 |
| 938 | 0.0287 | -0.0009 | -3.14 |
| 453 | 0.0282 | -0.0008 | -2.84 |
| 718 | 0.0284 | -0.0006 | -2.11 |
| 950 | 0.0283 | -0.0006 | -2.12 |
| 1720 | 0.0279 | -0.0005 | -1.79 |
| AVERAGE | 0.02855 | -0.0007 | -2.40 |
| STD DEV | 0.00076 | 0.0001 | 0.36 |
| MIN | 0.02550 | -0.0009 | -3.14 |
| MAX | 0.02960 | -0.0005 | -1.79 |

*FIG. 7*

WAFERS STRIPPED AND CURED, NORMAL PROCESS

| WAFER # | POLYIMIDE WEIGHT | WEIGHT DELTA FROM STRIP | % WEIGHT LOSS | WEIGHT DELTA FROM CURE | % CURE WEIGHT LOSS |
|---|---|---|---|---|---|
| 720 | 0.0279 | -0.0013 | -4.66 | -0.0073 | -26.16 |
| 183 | 0.0282 | -0.0018 | -6.38 | -0.0075 | -26.60 |
| 715 | 0.0284 | -0.0016 | -5.63 | -0.0075 | -26.41 |
| 1271 | 0.0287 | -0.0018 | -6.27 | -0.008 | -27.87 |
| 1272 | 0.0287 | -0.0018 | -6.27 | -0.0079 | -27.53 |
| 951 | 0.0286 | -0.0018 | -6.29 | -0.0079 | -27.62 |
| 758 | 0.0287 | -0.0017 | -5.92 | -0.0077 | -26.83 |
| 760 | 0.0287 | -0.0018 | -6.27 | -0.0077 | -26.83 |
| 759 | 0.0298 | -0.0018 | -6.04 | -0.008 | -26.85 |
| 938 | 0.0288 | -0.0017 | -5.90 | -0.0079 | -27.43 |
| 453 | 0.0284 | -0.0017 | -5.99 | -0.0076 | -26.76 |
| 718 | 0.0289 | -0.0021 | -7.27 | -0.0078 | -26.99 |
| 950 | 0.0288 | -0.002 | -6.94 | -0.0077 | -26.74 |
| 1720 | 0.0287 | -0.002 | -6.97 | -0.0075 | -26.13 |

WAFERS "RINSED" AND STRIPPED

| WAFER # | POLYIMIDE WEIGHT | WEIGHT DELTA FROM STRIP | % WEIGHT LOSS | WEIGHT DELTA FROM CURE | % CURE WEIGHT LOSS |
|---|---|---|---|---|---|
| 751 | 0.0285 | -0.0015 | -5.26 | -0.0074 | -25.96 |
| 724 | 0.028 | -0.0017 | -6.07 | -0.007 | -25.00 |
| 753 | 0.0284 | -0.0016 | -5.63 | -0.0073 | -25.70 |
| 1723 | 0.0251 | -0.0015 | -5.98 | -0.007 | -27.89 |
| 452 | 0.0286 | -0.0017 | -5.94 | -0.0075 | -26.22 |
| AVERAGE | 0.028416 | -0.0017 | -6.09 | -0.0076 | -26.71 |
| STD DEV | 0.00089 | 0.00019 | 0.59 | 0.00030 | 0.76 |
| MIN | 0.02510 | -0.0021 | -7.27 | -0.0080 | -27.89 |
| MAX | 0.02980 | -0.0013 | -4.66 | -0.0070 | -25.00 |

WAFERS DRIED THROUGH SEMITOOL, NO RINSE, NOT STRIPPED

| WAFER # | POLYIMIDE WEIGHT | WEIGHT DELTA FROM STRIP | % WEIGHT LOSS | WEIGHT DELTA FROM CURE | % CURE WEIGHT LOSS |
|---|---|---|---|---|---|
| 937 | 0.0287 | 0.0003 | 1.05 | -0.0077 | -26.83 |
| 717 | 0.0286 | 0.0003 | 1.05 | -0.0076 | -26.57 |
| 752 | 0.0287 | 0.0001 | 0.35 | -0.0076 | -26.48 |
| AVERAGE | 0.02867 | 0.00023 | 0.81 | -0.00763 | -26.63 |

FIG. 8

| WAFER # | % STRIP WEIGHT LOSS | % CURE WEIGHT LOSS |
|---|---|---|
| 720 | -4.66 | -26.16 |
| 183 | -6.38 | -26.60 |
| 715 | -5.63 | -26.41 |
| 1271 | -6.27 | -27.87 |
| 1272 | -6.27 | -27.53 |
| 951 | -6.29 | -27.62 |
| 758 | -5.92 | -26.83 |
| 760 | -6.27 | -26.83 |
| 759 | -6.04 | -26.85 |
| 938 | -5.90 | -27.43 |
| 453 | -5.99 | -26.76 |
| 718 | -7.27 | -26.99 |
| 950 | -6.94 | -26.74 |
| 1720 | -6.97 | -26.13 |

WAFERS "RINSED" BEFORE STRIP

| | | |
|---|---|---|
| 751 | -5.26 | -25.96 |
| 724 | -6.07 | -25.00 |
| 753 | -5.63 | -25.70 |
| 1723 | -5.98 | -27.89 |
| 452 | -5.94 | -26.22 |

| | | |
|---|---|---|
| AVERAGE | -6.09 | -26.71 |
| STD DEV | 0.59 | 0.76 |
| MIN | -7.27 | -27.89 |
| MAX | -4.66 | -25.00 |

DETERMINE IF DRYING PROCESS IS CAUSING CHANGE
WAFERS DRIED THROUGH SEMITOOL, NO RINSE, NOT STRIPPED

| | | |
|---|---|---|
| 937 | 1.05 | -26.83 |
| 717 | 1.05 | -26.57 |
| 752 | 0.35 | -26.48 |
| AVERAGE | 0.81 | -26.63 |

*FIG. 9*

| SEMITOOL RINSE TIME | % RINSE WEIGHT LOSS | % CURE WEIGHT LOSS |
|---|---|---|
| 30 | 0.00 | -24.7 |
| 30 | -0.35 | -25.4 |
| 30 | -0.36 | -25.2 |
| 1 MIN | -0.68 | -23.9 |
| 1 MIN | -0.35 | -24.4 |
| 1 MIN | -2.59 | -22.6 |
| 2 MIN | -2.12 | -24.7 |
| 2 MIN | -2.46 | -24.6 |
| 2 MIN | -2.46 | -24.6 |
| 3 MIN | -2.18 | -22.9 |
| 3 MIN | -2.84 | -24.8 |
| 3 MIN | -3.19 | -24.8 |
| 4 MIN | -3.58 | -23.3 |
| 4 MIN | -4.21 | -25.3 |
| 4 MIN | -2.81 | -24.6 |
| 5 MIN | -4.93 | -25.0 |
| 5 MIN | -4.91 | -25.3 |
| 5 MIN | -4.23 | -25.0 |
| 10 MIN | -7.80 | -24.5 |
| 10 MIN | -6.81 | -23.7 |
| 10 MIN | -7.80 | -24.8 |
| 10 MIN | -8.80 | -28.0 |
| AVERAGE % | -3.2 | -24.6 |
| STD DEV | 2.9 | 1.1 |
| MIN | -8.8 | -28.0 |
| MAX | 2.6 | -22.6 |

*FIG. 10*

METHOD OF SEMICONDUCTOR FABRICATION UTILIZING RINSE OF POLYIMIDE FILM

BACKGROUND OF THE INVENTION

The present invention relates to wet processing of semiconductor substrates including a rinse of a soft baked polyimide film prior to further photolithography processing.

Polyimides are widely used in the microelectronics industry. Polyimide films are typically utilized in semiconductor devices as insulators, interlevel dielectrics and passivation layers for various types of metallurgy. Polyimides are preferred over inorganic insulators because they typically have a lower dielectric constant, are more amenable to film processing, and include a wide variety of chemistries that can be chosen to meet the functional requirements for different applications.

Conventional flexible chain polyimides include that derived from pyromellitic dianhydride-4,4'-oxydianiline (PMDA-ODA) polymer precursor solution. This solution is formed by the condensation reaction of PMDA and ODA in N-methylpyrrolidone (NMP). Other conventional polyamic acid precursors used in semiconductor fabrication processes are derived from the condensation reaction of 3,3',4,4'-biphenyltetracarboxylic acid dianhydride (BPDA) and p-phenylenediamine (PDA) in NMP. The precursors are prepared with NMP as the solvent in a conventional manner.

It is an object of the present invention to provide an improved semiconductor fabrication process which yields better defined patterns and greatly enhances the uniformity and repeatability of the photolithographic process.

SUMMARY OF THE INVENTION

The present invention provides a method of fabricating a patterned polyimide film on a semiconductor wafer including spin coating the wafer with a polyimide precursor solution, baking the polyimide precursor solution in order to remove solvents from and to slightly cure the solution to form a polyimide film, and rinsing the polyimide film with deionized water immediately following the baking step. The rinsing serves to further remove solvents associated with the polyimide film. The process continues with photolithography techniques in which the wafer spin coated with a selected photoresist to form a photoresist film immediately following the rinsing step, and a baking of the photoresist film. Thereafter, the photoresist film is exposed to radiation through a photomask, and developed with a solution to form a pattern. The pattern is then etched into the polyimide film with the solution. The portions of the photoresist and the polyimide film which were exposed to radiation are removed with a chemical stripper. The wafer is then baked to fully cure the pattern formed in the polyimide film.

BRIEF DESCRIPTION OF THE DRAWINGS

FIG. 6 shows the results of a polyimide weight gain/thickness change experiment;

FIG. 7 shows the results of a polyimide rinse test in which bare silicon wafers were coated with a polyimide film, soft baked-cured and rinsed in accordance with the present invention;

FIG. 8 shows the results of testing involving wafers being stripped and cured with the conventional process, wafers rinsed in accordance with the present invention and stripped, and wafers not rinsed and not stripped;

FIG. 9 shows the results of a polyimide rinse process test to determine the standard processing weight change;

FIG. 10 shows the results of a test to determine the effect of rinsing time on the polyimide film weight change;

DETAILED DESCRIPTION OF THE ILLUSTRATED EMBODIMENTS

Figure 1A:
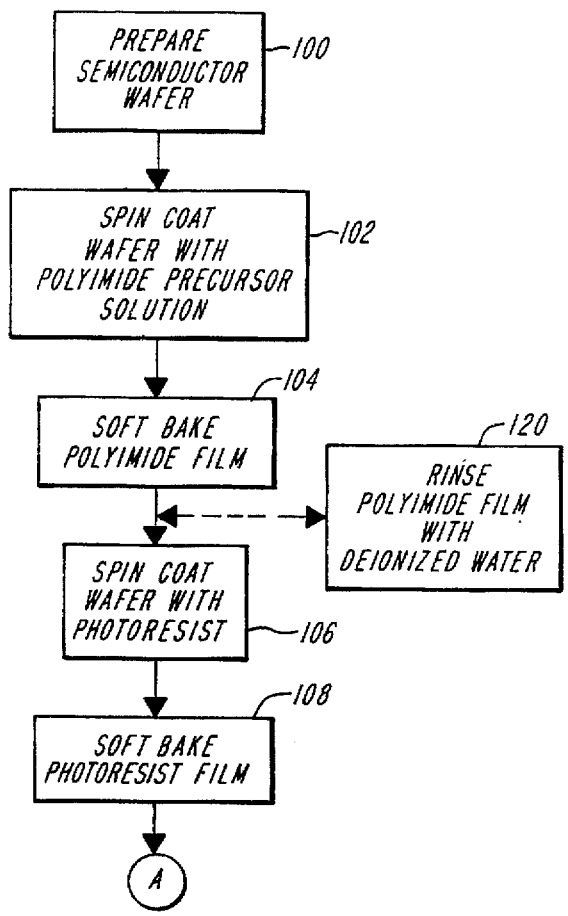
FIGS. 1A and 1B show a flow chart of the semiconductor patterning fabrication process of the present invention.
Figure 1B:
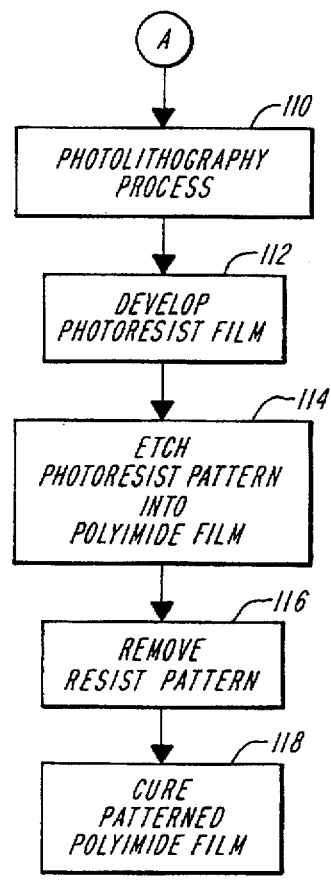

The present invention is a modification of an industry acceptable semiconductor fabrication process involving the wet processing and patterning of non-photosensitive polyimide films. With reference to the flowchart of FIGS. 1A and 1B, the process in accordance with the present invention is shown.

The process starts at a step 100 where a semiconductor substrate, such as a silicon wafer is prepared in a conventional manner for further processing. The wafer is placed on a conventional spinning vacuum chuck and then subjected to a spin coating of polyimide precursor solution in a manner to achieve uniform coating of the wafer surface (step 102). Thereafter, the coated wafers are placed in a conventional oven in order to soft bake the polyimide film (step 104). The soft bake is performed in order to remove solvents and slightly cure the film. The wafer is baked, for example, at about 120°–160° C. for five to thirty minutes.

The process continues with a spin coating of the silicon wafers with a selected photoresist (step 106). The photoresist as is well known in the art is a positive or negative photographic type emulsion which is sensitive only to ultraviolet light. Conventionally available positive photoresists are typically based on diazonaphthoquinone-novolac systems, and include the likes of AZ1350-J manufactured by American Hoescht. Thereafter, the wafer coated with photoresist film is soft baked (step 108). This baking can be at temperatures ranging from 85° C.–95° C. for between two and fifteen minutes. The baking of the photoresist is performed at milder temperatures so as to avoid further curing of the polyimide film.

The coated wafer is then subjected to a photolithography process in order to pattern the photoresist using standard optical procedures (step 110). For example, a photomask is placed over the wafer using a Perkin Elmer 300HT Micralign semiconductor mask aligner. The wafer is aligned with the mask and exposed to ultraviolet light for a predetermined time. Thus, the exposed areas of the coated wafer become soluble in chemicals. Mask patterns can typically be as small as 1/25,000 of an inch.

The photoresist film is next developed using an alkaline solution (step 112). The wafer is dipped into a bath of developing solution where the exposed portions of the resist dissolve away. A preferred solution for development is tetramethylammoniumhydroxide (TMAH). The developer solution and process for application is preferably chosen to fully remove the exposed photoresist to create a photoresist pattern. Concurrently, the photoresist pattern is etched into the underlying polyimide film as a latent image using the alkaline solution (step 114). The etching/developing step lasts for approximately fifteen seconds to two minutes, and does not attack the resist pattern. The resist pattern is then removed with a conventional solvent chemical stripper (step 116). Preferably, the chemical stripper is chosen so as not to affect the patterned polyimide film.

Lastly, the wafers are again baked in accordance with a predetermined range in order to fully cure the patterned polyamide film (step 118). This baking serves to fully convert the polyimide film to a permanent polyimide dielectric. For example, the wafers can be baked from 300° C.–400° C. for about thirty to sixty minutes.

In accordance with the present invention, it has been found that the above described process can be improved by implementing a step of rinsing the wafers with deionized (DI) water (step 120) immediately following the initial soft bake of the polyimide film. The advantages of this unique step of rinsing the soft baked polyimide film with deionized water are provided hereinafter.

The object of the fabrication process is to achieve a result in which vias are etched into the polyimide film, allowing electrical contact between metal layers, bond wires, etc. These vias have specified geometries, i.e. critical dimensions. The rinse process in accordance with the present invention greatly increases the repeatability and uniformity of the size of these vias. The process becomes more reliable on a per wafer-to-wafer basis.

Figure 2A:
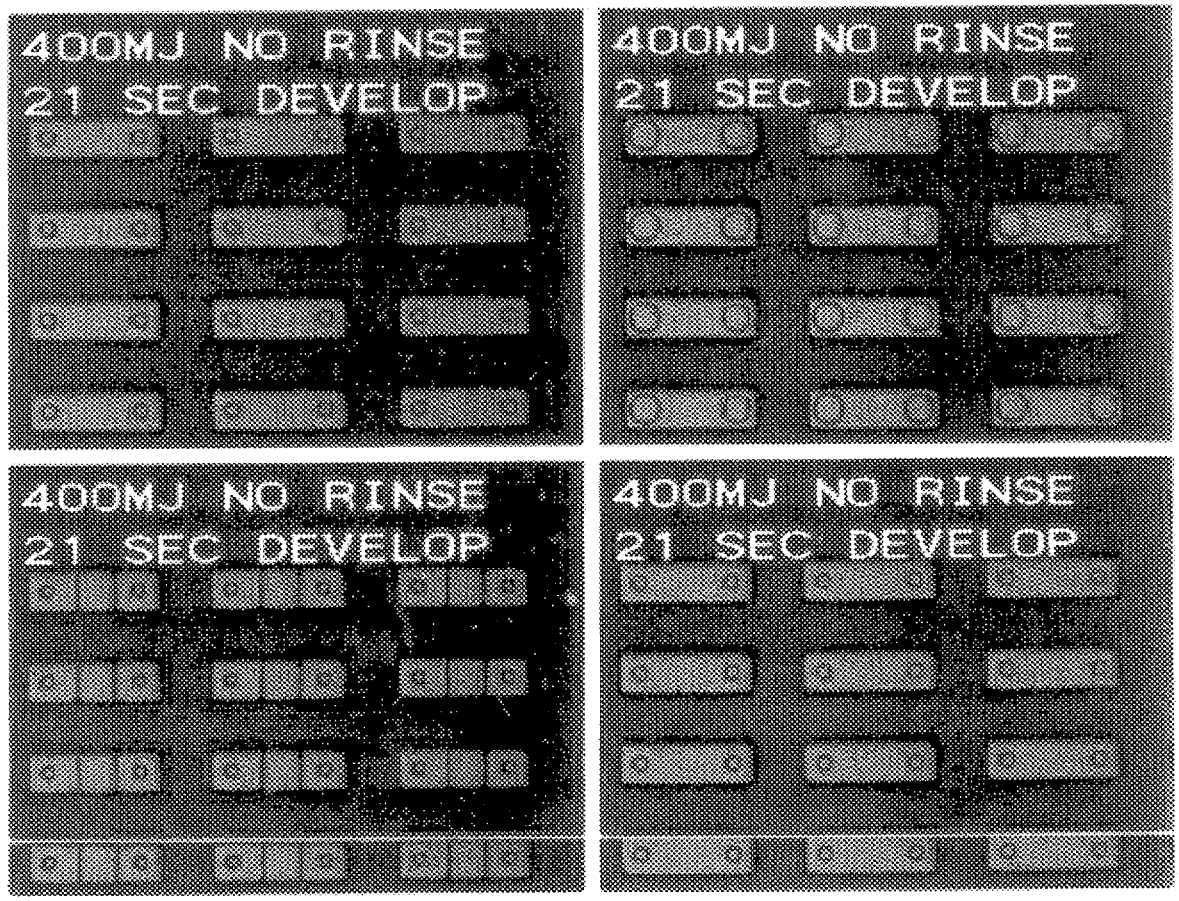
FIGS. 2A and 2B show top view photographs of resulting patterns fabricated on a semiconductor device using conventional techniques and using the process in accordance with the present invention including rinsing the soft baked polyimide films with deionized water.
Figure 2B:
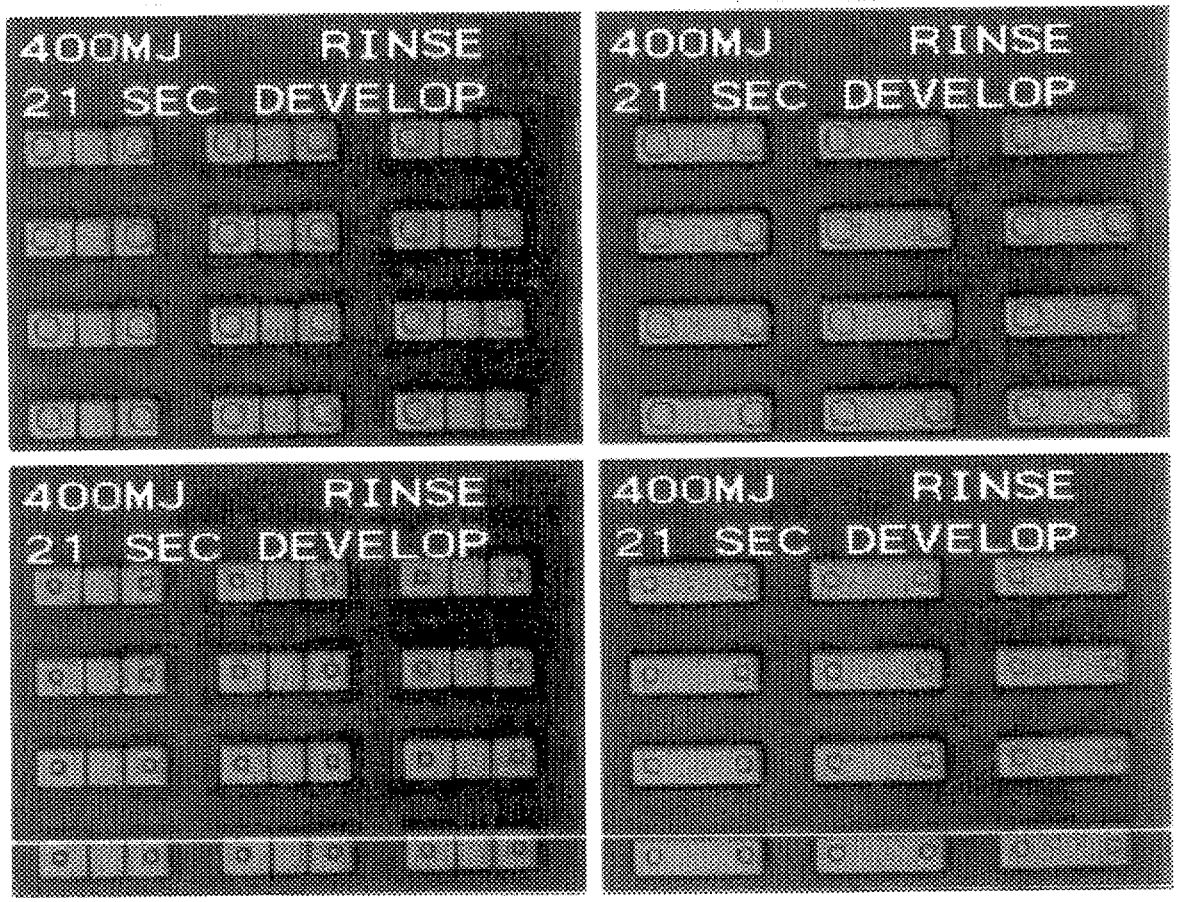
Figure 3A:
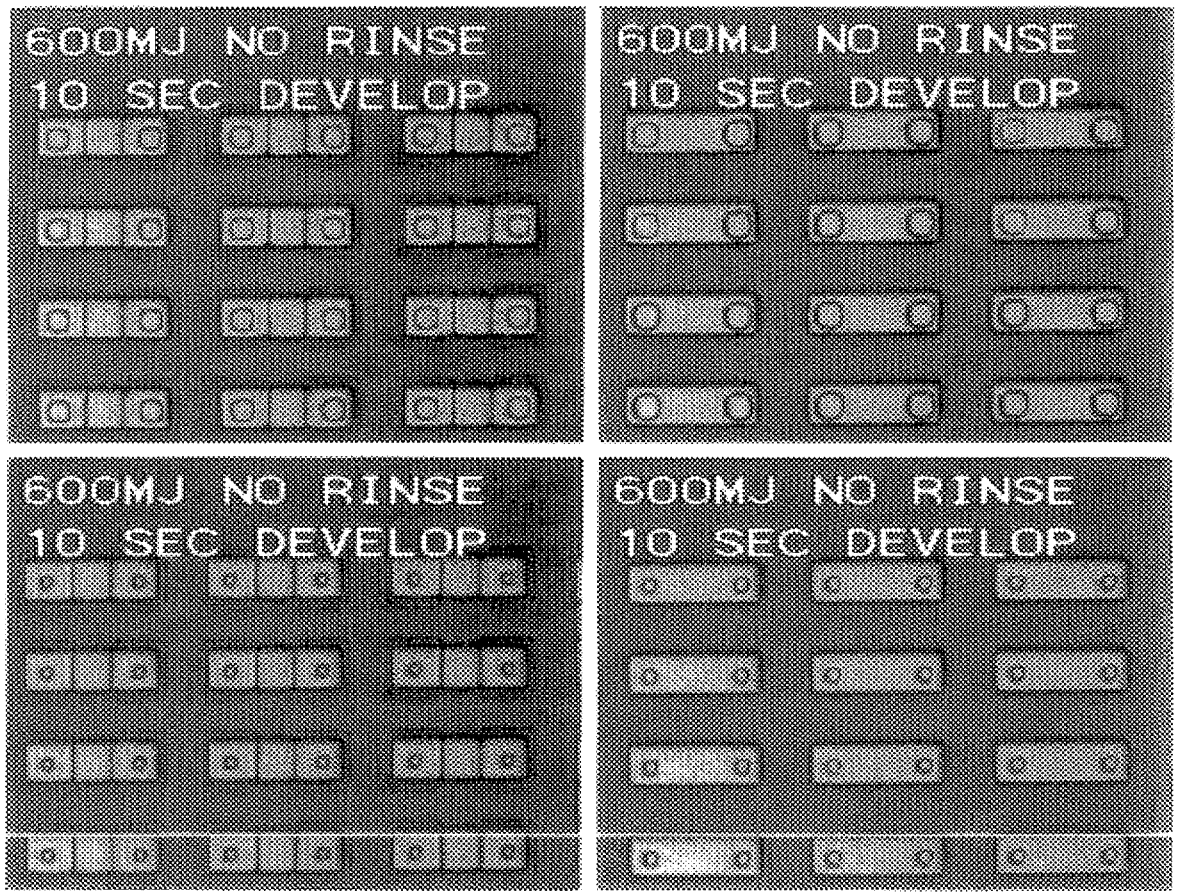
FIGS. 3A and 3B show top view photographs of additional resulting patterns fabricated on a semiconductor device using conventional techniques and using the process in accordance with the present invention including rinsing the soft baked polyimide films with deionized water.
Figure 3B:
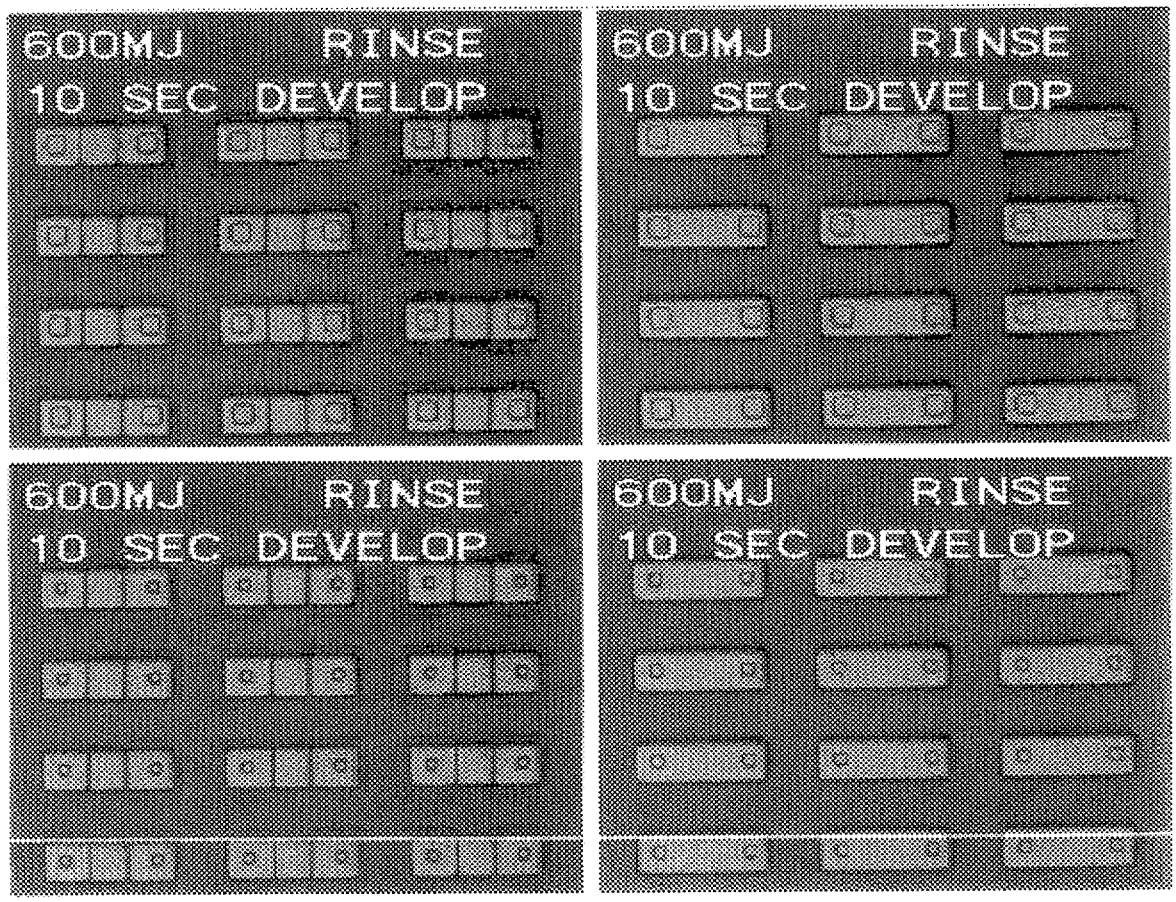

The results of this process can be garnered from the topographic photographs of exemplary pattern etches as shown in FIGS. 2A–2B and 3A–3B. FIGS. 2A and 3A show vias processed in patterned wafers using the fabrication process of FIG. 1 without the deionized water rinse step 120. These can be compared directly to the photographs of FIGS. 2B and 3B which were fabricated using the rinse step 120. The wafers were processed identically, except for the rinse process. The wafers of FIGS. 2A and 2B were fabricated in matching conditions including a 400 MJ ultraviolet exposure and a development time of 21 seconds. The wafers of FIGS. 3A and 3B were also fabricated in matching conditions including a 600 MJ ultraviolet exposure and a development time of 10 seconds. The results as can be seen upon inspection of these photographs are that the patterns resulting from the process including the rinse step 120 are more definite, while the patterns on the non-rinsed wafers are overetched and thus less definite. The procedure of rinsing the soft baked polyimide film with deionized water will enhance lithographic procedures to the point where smaller vias will be opened on a more reliable and repeatable basis.

Testing has indicated that the rinsing process in accordance with the present invention removes some material from the polyimide film as evidenced by a weight change in the wafers after the process.

Several tests were conducted in conjunction with the rinsing process in accordance with the present invention. For example, testing was conducted to determine the mechanical properties of the soft baked polyimide film after rinsing with deionized water. The test involved the use of two sets of oxide coated wafers which were spin coated with fairly thick films of polyimide precursor solution PI2545 primed with VM-651. In the first set, at least one wafer was not rinsed in accordance with the present invention, at least one wafer was rinsed for 3 minutes, and at least one wafer was rinsed for 10 minutes. The second set of wafers included three wafers which were not rinsed in deionized water, three wafers which were rinsed for 10 minutes, and three wafers which were rinsed for 30 minutes. Two of each subset of the second set of wafers were cured during a soft bake at 350° C. in nitrogen.

Nuclear magnetic resonance (NMR) spectra were obtained of the soft baked films, while mechanical properties were measured on the cured films. The NMR analysis clearly shows that the NMP content in the polyimide films are greatly reduced by water rinsing. The results also show that the water content of the films is increased to an equilibrium value early in the rinsing process. The experimental method and results are described below.

Wafers from each subset of the first and second sets described above were subjected to a scraping of the polyimide film with a razor blade. The film scrapings were then mixed in small glass tubes with perdeuterated dimethyl sulfoxide containing 0.05% tetramethylsilane (TMS, and NMR internal standard). The films dissolved quite readily and were pipetted into NMR tubes using a small glass wool filter to catch any particles. The NMR spectra were obtained with a Bruker XL-300 fourier transform spectrometer. This conventional computer driven instrument automatically adjusts the sample phasing and runs peak area integration. The NMR spectra plot proton intensities versus frequency: the frequency at which proton absorbs radiation is a function of the chemical and nuclear spin environments. For proton NMR, these intensities are directly proportional to the population of protons in the given environment.

Figure 4:
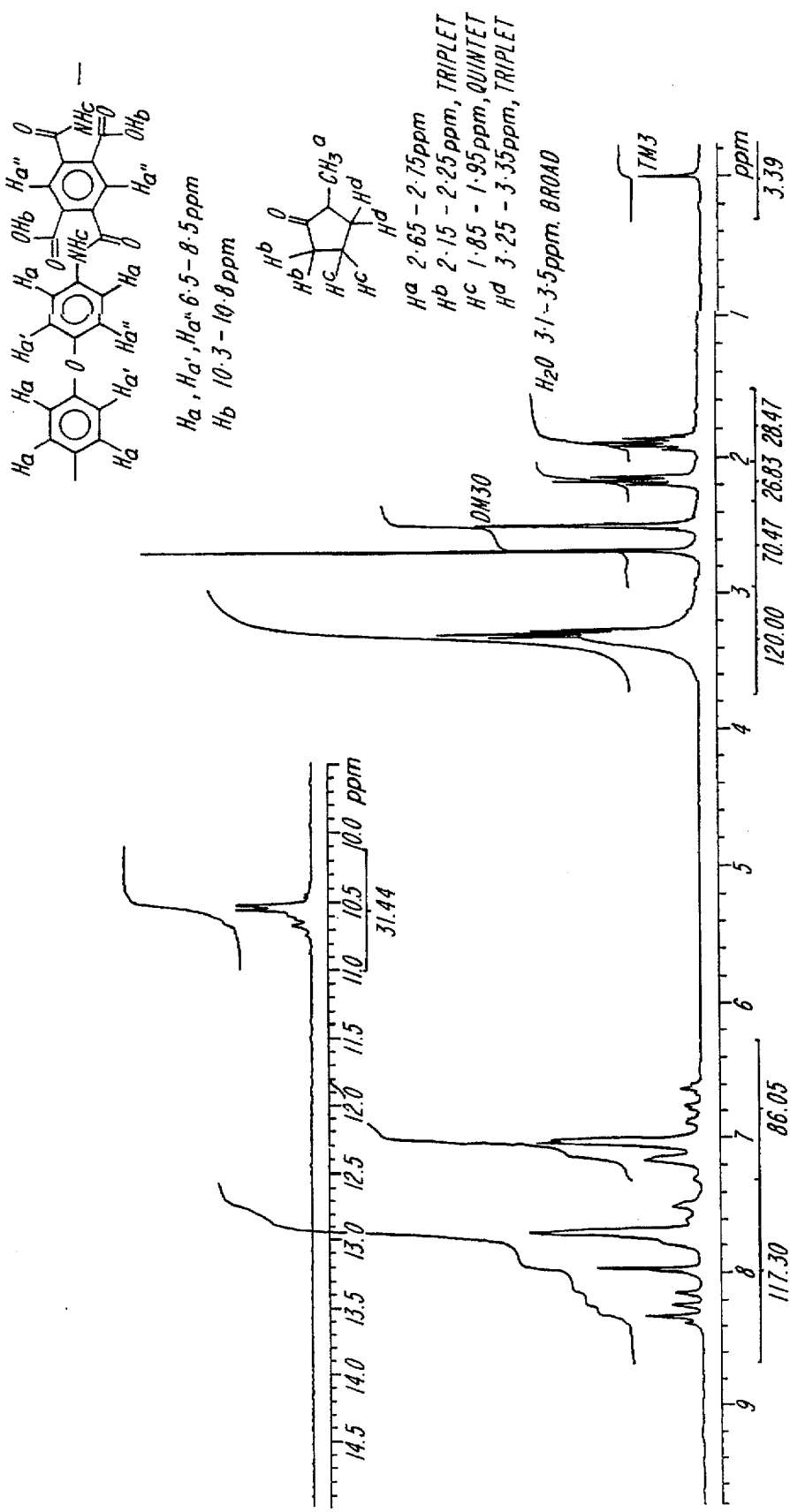
FIG. 4 shows an NMR spectrum plot for polyimide film scraped from a wafer which was not rinsed in accordance with the present invention.

FIG. 4 shows the NMR spectrum plot for the film scraped from a wafer in the first set which was not rinsed in accordance with the present invention. The spectrum is annotated with the peak assignments for the various types of protons. It will be appreciated by those of skill in the art that the peak locations are expressed as frequency shifts in ppm from the resonance frequency of TMS. To analyze the spectra, the following spectral regions:

| Region A | 1.75–2.15 ppm | 4 protons from NMP |
| Region B | 3.0–3.6 ppm | water and 2 protons from NMP |
| Region C | 6.5–8.5 ppm | aromatic protons from PMDA/ODA |
| Region D | 10.3–10.8 ppm | carboxylic acid protons |

With respect to the first set of wafers, the integrated peak areas for the three samples are shown in Table 1 provided below.

TABLE 1

| Wafer | 1 | 2 | 3 |
|---|---|---|---|
| Rinse Time (min) | 0 | 3 | 10 |
| $I_A$ | 55.3 | 28.59 | 10.24 |
| $I_B$ | 120 | 120 | 120 |
| $I_C$ | 203.35 | 121.89 | 154.37 |
| $I_D$ | 31.44 | 22.23 | 22.24 |
| $I_W$ | 92.35 | 105.705 | 114.88 |

TABLE 1-continued

| Wafer | 1 | 2 | 3 |
|---|---|---|---|
| % NMP | 13.6 | 11.1 | 3.5 |
| % H2O | 8.3 | 14.9 | 14.3 |
| H2O/NMP | 0.61 | 1.34 | 4.07 |

These integrated intensities are denoted as $I_A$, $I_B$, $I_C$, and $I_D$. The weight percent NMP in each sample was determined as follows.

The ratio of molecules on NMP to repeat units of PMDA/DA is given by he $I_A/4$ divided by $I_C/10$. The water content is derived from $I_B$ and $I_A$: water intensity $I_W=I_B-\frac{3}{4} I_A$. The weight percent NMP is then %NMP=100(99.13 $I_A/4$)/( (386.31 $I_C/10$)+(99.13$I_A/4$)+(18 $I_W/2$)). This formula compensates the mole ratios for the molecular weights on NMP (99.13) and water (18) as well s the repeat unit weight for PI2545 (386.31).

Calculating the water content is complicated by several factors. First, since the wafers were exposed to ambient (and a fairly hot and humid ambient at that), the wafers probably absorbed water following the rinse treatment. Second, since DMSO is a hygroscopic solvent and the samples were made under ambient conditions, even though efforts were made to minimize the exposure time, there was probably some water uptake during sample prep. Third, protons from carboxylic groups, water and amides tend to exchange fairly rapidly, which can cause spectral line broadening. The intensity of the DMSO peak indicates that some exchange of protons with the DMSO has taken place. Lastly, the need to subtract off the NMP intensity from $I_B$ increases the error.

Figure 5:
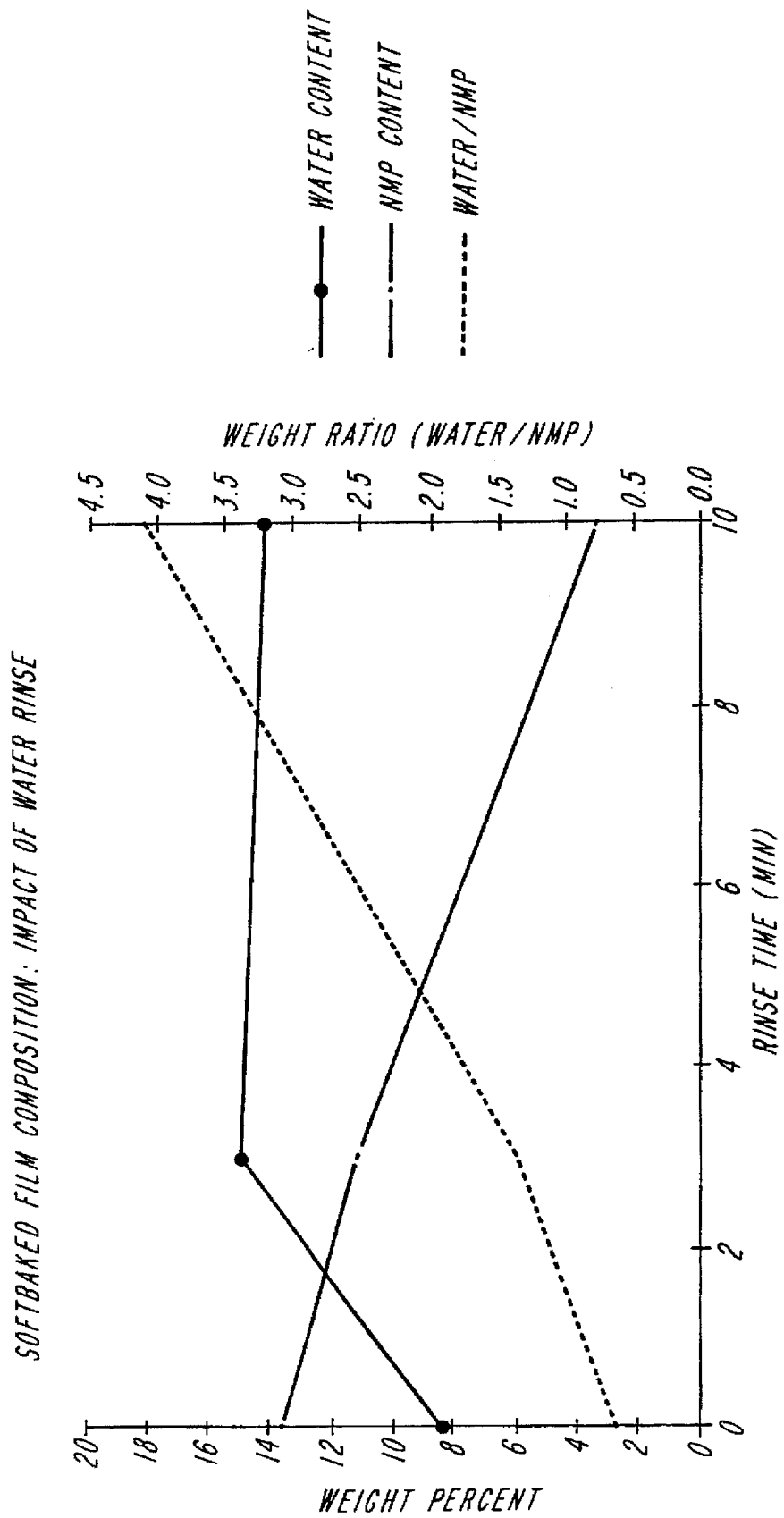
FIG. 5 shows a plot of the calculated weight percent NMP and water for samples listed in Table 1.

With these caveats, the calculated weight percent NMP and water for each sample is listed in Table 1. These values are plotted in FIG. 5 along with the ratio of water to NMP. While the water values may not be accurate, the trends are real and clear. The key findings from this experiment are that the NMP level falls as the rinse time increases; after 10 minutes most of the NMP has been removed. The water in the sample appears to increase to an equilibrium value after less than three minutes of rinse.

With respect to the second set of wafers, the integrated peak areas for the three samples are shown in Table 2 provided below.

TABLE 2

| Rinse Time (min) | 0 | 10 | 30 |
|---|---|---|---|
| $I_A$ | 47 | 53 | 31 |
| $I_C$ | 79.44 | 120 | 120 |
| $I_D$ | 11.69 | 18.59 | 18.19 |
| % NMP | 27.5 | 22.1 | 14.2 |

These integrated intensities are denoted as $I_A$, $I_B$, $I_C$ and $I_D$. The weight percent NMP in each sample was determined as follows.

The ratio of molecules of NMP to repeat units of PMDA/ODA is given by the $I_A/2$ divided by $I_C/10$. The weight percent NMP is %NMP=100(99.13 $I_A/4$)/((386.31 $I_C/10$)+ (99/13 $I_A/4$)). This formula compensates the mole ratios for the molecular weights of NMP (99.13) and the repeat unit weight for PI2545 (386.31). In these experiments, very little water was seen in the spectra, so the water fraction was not calculated. Also, because these films were thicker than the first films studied, there is a higher percentage of NMP in the non-rinsed film (NMP is more readily removed from thin film at same process condition) and the extraction of the NMP takes longer.

Table 3 provided below shows the results of the mechanical testing.

TABLE 3

| Rinse Time (min) | 0 | 10 | 30 |
|---|---|---|---|
| Thickness (μm) | 10.9 | 10.9 | 10.8 |
| Tensile Strength (MPa) | 222 | 175 | 218 |
| std dev. | 10 | 28 | 25 |
| Elongation (%) | 83 | 65 | 77 |
| std dev. | 3 | 13 | 8 |
| Modulus (GPa) | 2.1 | 2.05 | 2.1 |
| std dev. | 0.14 | 0.07 | 0.1 |

There is some scatter in the data, it is believed that the mechanical properties of the cured films are not significantly different.

In addition further laboratory tests were conducted to determine the effects of the rinsing step of the present invention. A thickness test was configured in order to determine whether there were any thickness variations between wafers fabricated with and without the deionized water rinsing step of the invention. One exemplary test involved six bare silicon wafers which were coated with a polyimide film as previously described. A measurement of the thickness of all wafers was conducted using a conventional Rudolph/FTM thickness measuring device. Two of the wafers were run through the rinse step 120 in accordance with the present invention. Two wafers were run through the strip process as described above without the rinse step 120. The remaining two wafers were not further processed in any manner. Thereafter, all of the wafers were weighed in a conventional manner, and the wafers measured for thickness. The wafers were then cured as previously described, and once again measured for thickness. Lastly, a final measurement of weight for all of the wafers was taken.

An alternative test was configured with respect to exposure and development. Half of a predetermined lot of wafers was run through the rinse step in accordance with the present invention in which the soft baked polyimide film is rinsed with deionized water. Thereafter, all of the wafers were coated with resist as described above. The wafers were then subjected to mask alignment and exposure at differing exposure levels. Next, the wafers were developed at differing time periods using TMAH as described above. The wafers were then stripped and cured. An inspection was made of the wafers, grading each on the quality of the resulting vias. Lastly, measurements of the via size (if possible) of small deep vias and shallows vias were taken using a conventional OSi Metro 2150 m measuring device.

The above tests were performed to show that the properties of the final polyimide film are not affected by the rinse step of the present invention, i.e. thickness, weight, etc. Results from the varying tests will now be described. With reference to the tables of FIG. 6, the results of a polyimide weight gain/thickness change experiment are provided. The wafers 1 and 2 (semi rinse) received a rinse cycle of 3 minutes rinse followed by 5 minutes spin dry. Wafers 3 and 4 (stripped) involved a predetermined strip process at 40° C. followed by a 5 minute rinse and 5 minute spin dry cycle. The wafers were cured for 30 minutes between 300° C. and 400° C.

The table of FIG. 7 shows the results of a polyimide rinse test in which bare silicon wafers were coated with a polyimide film, soft baked-cured and rinsed in accordance with the present invention.

The tables of FIG. 8 show the results of testing involving wafers being stripped and cured with the conventional process, wafers rinsed in accordance with the present invention and stripped, and wafers not rinsed and not stripped.

The tables of FIG. 9 show the results of a polyimide rinse process test to determine the standard processing weight change. Each of the wafers was weighed before coating, after coating, after stripping and after curing. A set of wafers received a standard coating of polyimide film and cured. The stripping process of these wafers had a strip cycle of 5 minutes/5 minutes at 45° C. and cured at between 300° C. and 400° C. for 25 minutes. The second set of wafers were rinsed in accordance with the present invention. The third set of wafers were dried, but not rinsed or stripped.

The table of FIG. 10 shows the results of a test to determine the effect of rinsing time on the polyimide film weight change. The wafers were coated, weighed, rinsed in accordance with the present invention, and weighed again.

Figure 11A:
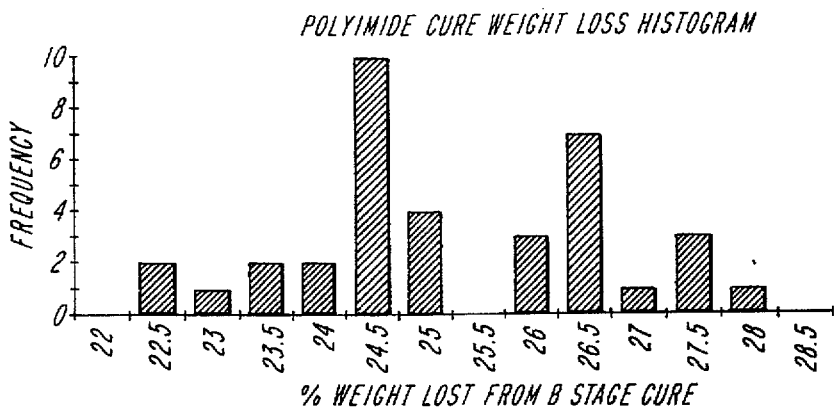
FIGS. 11A–11C show the results of Histogram readings for polyimide cure weight loss, a two minute rinse weight loss, and polyimide strip weight loss, respectively.
Figure 11B:
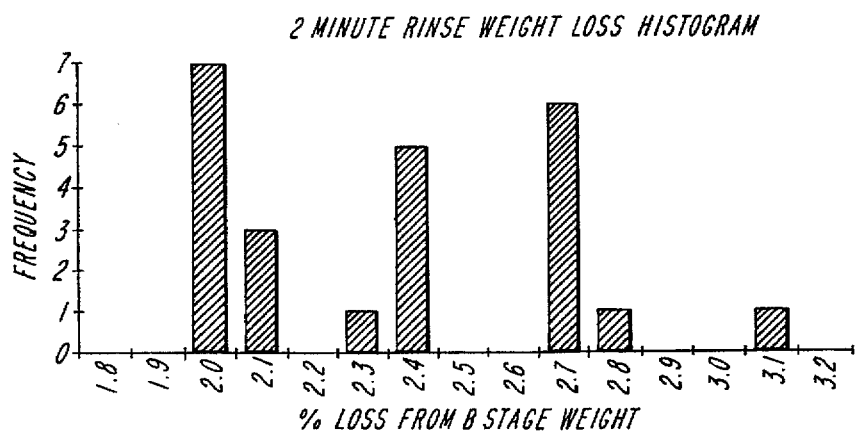
Figure 11C:
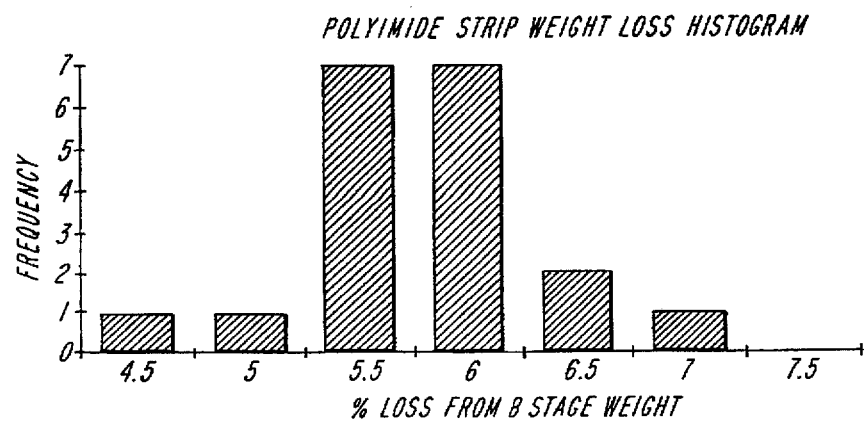

The graphs of FIGS. 11A–11C show the results of Histogram readings for polyimide cure weight loss, a 2 minute rinse weight loss, and polyimide strip weight loss, respectively.

Figure 12:
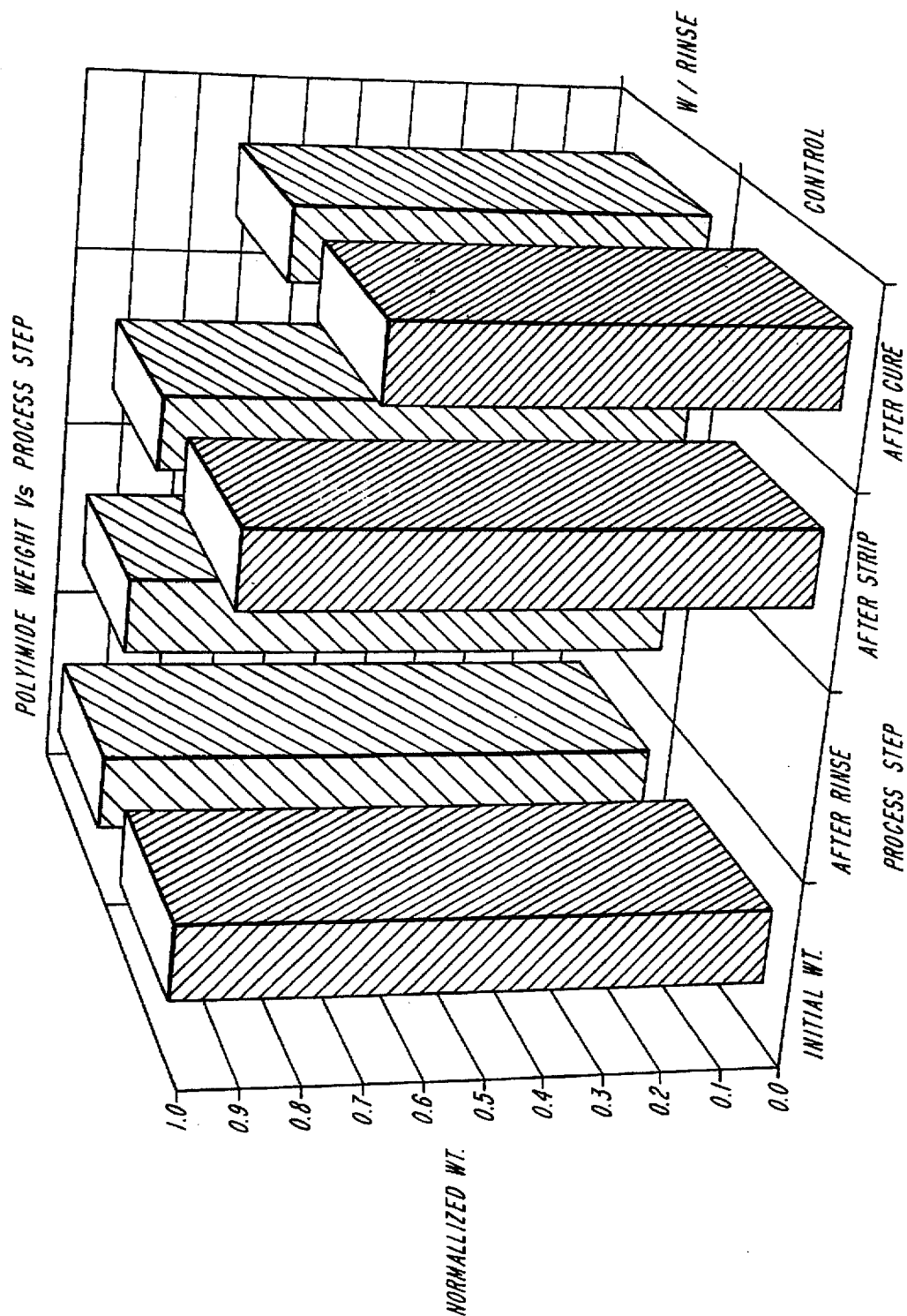
FIG. 12 shows the graphical relationship between polyimide film weight and the process steps for rinsing the soft baked polyimide film with deionized water in accordance with the present invention and not rinsing.

The graph of FIG. 12 shows the relationship between polyimide film weight and the process steps for rinsing the soft baked polyimide film with deionized water in accordance with the present invention and not rinsing.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A method of processing a semiconductor wafer, comprising:

coating said wafer with a polyimide precursor solution;

baking said polyimide precursor solution following said coating step in order to remove solvents from and to slightly cure said solution to form a partially cured polyimide film; and rinsing said polyimide film following said baking step and prior to further processing.

2. The method of claim 1, wherein said step of rinsing comprises rinsing with deionized water.

3. The method of claim 1, wherein said rinsing step further removes solvents associated with said polyimide film.

4. The method of claim 1 further comprising:

coating said wafer with a selected photoresist following said rinsing step to form a photoresist film; and baking said photoresist film.

5. The method of claim 4 further comprising:

exposing said photoresist film to radiation through a photomask;

developing said photoresist film with a solution to form a pattern; and etching said pattern into said polyimide film with said solution.

6. The method of claim 5 further comprising:

removing portions of said photoresist with a chemical stripper; and baking said wafer to fully cure the pattern formed in said polyimide film.

7. A method of fabricating a patterned polyimide film on a semiconductor wafer, comprising:

coating said wafer with a polyimide precursor solution;

baking said wafer and said polyimide precursor solution following said coating step in order to remove solvents from and to slightly cure said solution to form a partially cured polyimide film; and rinsing said polyimide film with deionized water immediately following said baking step and prior to further processing.

8. The method of claim 7, wherein said rinsing step further removes solvents associated with said polyimide film.

9. The method of claim 7 further comprising:

coating said wafer with a selected photoresist following said rinsing step to form a photoresist film immediately following said rinsing step; and baking said photoresist film.

10. The method of claim 9 further comprising:

exposing said photoresist film to radiation through a photomask;

developing said photoresist film with a solution to form a pattern; and etching said pattern into said polyimide film with said solution.

11. The method of claim 10 further comprising:

removing portions of said photoresist with a chemical stripper following said etching step; and baking said wafer to fully cure the pattern formed in said polyimide film.

12. A semiconductor wafer having a patterned polyimide film produced thereon, said patterned polyimide film produced by coating said wafer with a polyimide precursor solution, baking said polyimide precursor solution following said coating in order to remove solvents from and to slightly cure said solution to form a partially cured polyimide film, and rinsing said polyimide film with deionized water immediately following said baking step and prior to further processing.

* * * * *